United States Patent
Yami et al.

(10) Patent No.: US 10,707,120 B1
(45) Date of Patent: Jul. 7, 2020

(54) SOI DEVICES WITH AIR GAPS AND STRESSING LAYERS

(71) Applicant: Tower Semiconductor Ltd., Migdal Haemek (IL)

(72) Inventors: Bouhnik Yami, Zikhron Yakov (IL); Nagar Magi, Zippori (IL); Barhum Liat, Tirai HaCarmel (IL); Alexey Heiman, Ramat Ishai (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 16/373,925

(22) Filed: Apr. 3, 2019

(51) Int. Cl.
*H01L 21/4763* (2006.01)
*H01L 21/768* (2006.01)
*H01L 21/762* (2006.01)
*H01L 29/06* (2006.01)
*H01L 27/12* (2006.01)

(52) U.S. Cl.
CPC .... *H01L 21/7682* (2013.01); *H01L 21/76224* (2013.01); *H01L 21/76802* (2013.01); *H01L 27/1203* (2013.01); *H01L 29/0649* (2013.01)

(58) Field of Classification Search
CPC ............. H01L 29/0649; H01L 27/1203; H01L 21/7682; H01L 21/76802
See application file for complete search history.

(56) References Cited

U.S. PATENT DOCUMENTS

| | | |
|---|---|---|
| 6,211,561 B1 | 4/2001 | Zhao |
| 6,509,623 B2 | 1/2003 | Zhao |
| 6,917,109 B2 | 7/2005 | Lur et al. |
| 7,534,696 B2 | 5/2009 | Jahnes et al. |
| 8,026,131 B2 | 9/2011 | Botula |
| 8,674,472 B2 | 3/2014 | Botula |
| 9,755,063 B1 | 9/2017 | Howard et al. |
| 2007/0111508 A1* | 5/2007 | Hayashi ............ H01L 21/76831 438/622 |
| 2016/0379943 A1 | 12/2016 | Mason et al. |
| 2017/0330790 A1 | 11/2017 | He et al. |

FOREIGN PATENT DOCUMENTS

WO  2009127914 A1  10/2009

* cited by examiner

*Primary Examiner* — Ermias T Woldegeorgis
(74) *Attorney, Agent, or Firm* — Bever, Hoffman & Harms, LLP

(57) ABSTRACT

An RF SOI device combines a triple-layer stressing stack and patterned low-k features (i.e., low-k polymer structures and/or air gap regions) disposed in pre-metal dielectric over the gate structures of NMOS transistors. The triple-layer stressing stack includes a thick SiN or oxynitride lower stressor layer that applies tensile stress in the channel regions of the NMOS transistors, a thin intermediate buffer layer, an upper etch-stop layer. After Metal-1 processing is completed, a special etching process is performed to define air gaps in the pre-metal dielectric over the NMOS gate structures using upper layer(s) of the triple-layer stressing stack as an etch stop to prevent damage to the stressor layer. A non-conformal dielectric material or an optional low-k dielectric material is then deposited in or over the air gaps to complete formation of the low-k features, and an optional capping or sealing layer is formed over the completed low-k features.

19 Claims, 8 Drawing Sheets

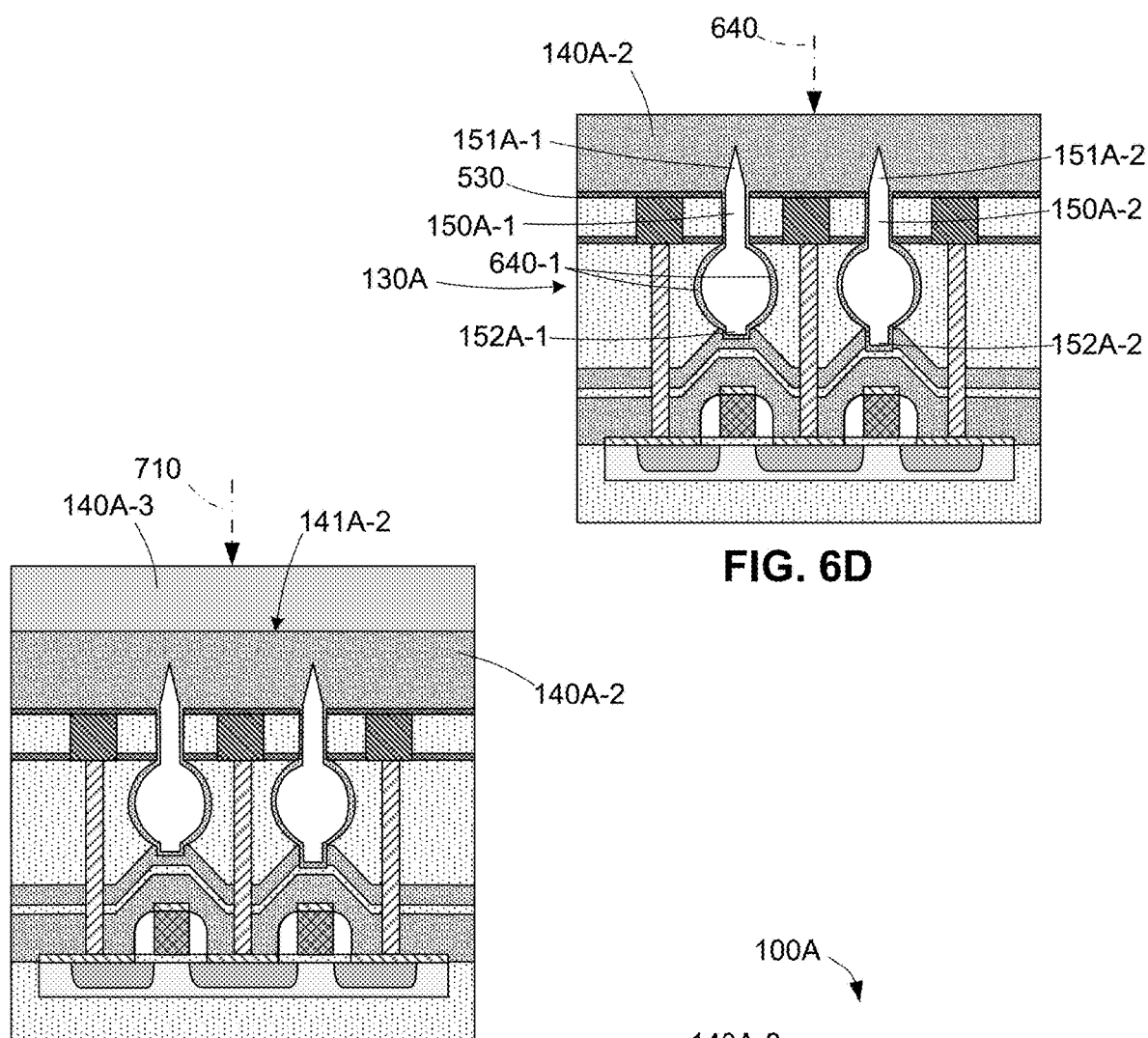
FIG. 6D
FIG. 7
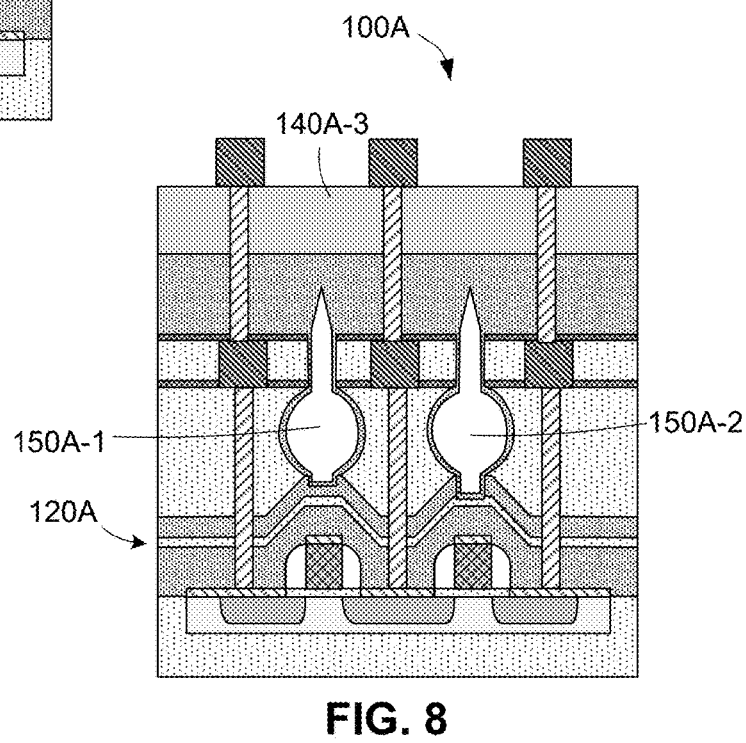
FIG. 8

US 10,707,120 B1

SOI DEVICES WITH AIR GAPS AND STRESSING LAYERS

FIELD OF THE INVENTION

This invention relates to Radio Frequency (RF) devices such as switches and power amplifiers, and more particularly to methods and structures that can be utilized to improve the operating characteristics of RF SOI devices.

BACKGROUND OF THE INVENTION

RF switches and power amplifiers represent two component RF devices that are commonly utilized in wireless communication devices (e.g., cellular or smart phones) to route high-voltage, low- and high-frequency signals through transmission paths between the device's processing circuitry and the device's antenna. For example, state-of-the-art attenuation and antenna tuning applications in such wireless communication devices require RF switches capable of transmitting RF signals up to 70V and in the range of 0.5 GHz to 6 GHz with a high degree of linearity. To accommodate the high-power RF signals, current state-of-the-art RF switches typically utilize several low voltage (e.g., 2-5V) NMOS transistors connected in a stacked (drain-to-source) arrangement such that the high RF signal voltage is distributed evenly across the low voltage transistors. With this arrangement, a first RF switch can be turned on to route high frequency signals from a wireless communication device's processing circuitry and a power amplifier circuit to an antenna during transmission-mode operations, and a second RF switch can be turned on to signals from the antenna to the wireless communication device's processor by way of a low-noise amplifier during receiving-mode operations.

RF switches that are produced using silicon-on-insulator (SOI) technology (referred to herein as RF SOI switches) were developed in response to a demand for low-cost solid-state RF switches for low-cost wireless communication devices. Silicon on insulator (SOI) technology refers to the use of a layered silicon-insulator-silicon substrate in place of conventional monocrystalline silicon substrates in semiconductor manufacturing, especially microelectronics, to reduce parasitic device capacitance, thereby improving performance. Early SOI technology was considered impractical for RF switch applications due to cutoff frequency and breakdown voltage problems, so early solid-state RF switches were typically generated using silicon-on-sapphire (SOS) and gallium-arsenide monolithic microwave integrated circuit (GaAs MMIC) technologies. However, due to advances in CMOS SOI technology that addressed the early problems, RF SOI switches produced using CMOS and SiGe BiCMOS flows (and in some instances using RF MEMS fabrication flows) are now recognized as achieving comparable operating characteristics to SOS and GaAs Monolithic microwave integrated circuit (MMIC) switches at a substantially lower cost. Moreover, because SOI technology uses standard technologies and standard cell libraries developed for CMOS, BiCMOS and RF MEMS fabrication flows, RF SOI switches can be integrated into larger system-on-chip (SOC) devices that further minimize fabrication costs.

RF SOI switches are field-effect transistor-type (FET-type) structures that are mainly distinguished from other FET-type transistors in that they are formed on/over isolated silicon pads (islands) of an SOI base substrate, but are otherwise produced using the same standard processes of the core (i.e., CMOS, BiCMOS or RF MEMS) fabrication flow that are utilized to simultaneously fabricate other circuit structures of a SOC device on the SOI base substrate. That is, the SOI substrate is typically processed using known techniques to generate spaced-apart silicon islands (i.e., portions of the topmost silicon layer that rests on and are surrounded by insulating material, typically silicon dioxide). The structural elements of the RF SOI switch are then fabricated onto an associated silicon island, typically using the same standard fabrication flow processes that are utilized to simultaneously generate other circuit structures of the SOC device. For example, the same standardized n-type or p-type dopant diffusion processes may be utilized to form source/drain regions in both the silicon island (i.e., for the RF SOI switch) and in other portions of the topmost silicon (e.g., to produce transistors forming a processor circuit or other functional circuitry of the SOC device). Similarly, the same polycrystalline silicon (polysilicon) gate structure formation processes (e.g., poly deposition, mask and etch) may be utilized to form the gate structures of the RF SOI switch, and to simultaneously form gate structures of the SOC device's functional circuitry. Next, the same pre-metal dielectric (PMD) layer formation process is typically utilized to form a PMD layer over the polysilicon gate structures of both the RF SOI switch and the other functional circuitry, and the same contact structure formation processes (e.g., mask, etch, metal deposition, and chemical mechanical polishing or other planarizing process) is typically used to form contacts to the source/drain regions in both the RF SOI switch and the functional circuitry. Subsequent backend processing (e.g., metallization and contact pad formation) is similarly simultaneously performed over both the RF SOI switch and the other functional circuitry of the SOC device.

As the demand for wireless communication devices capable of higher data-rate transmissions continues to grow, there is a concomitant demand for RF SOI switches that exhibit ever-improving operating characteristics. A conventional approach for improving the operating characteristics of an RF SOI switch is to minimize the switch's Ron·Coff, which is a common figure of merit used to rate the performance of RF switches. An RF SOI switch's Ron value is determined by measuring the resistance across the switch when turned on (e.g., in the NMOS case, when a high gate voltage is applied), and the RF SOI switch's Coff value is determined by measuring the capacitance across the switch when turned off. The Ron·Coff value is determined by multiplying a switch's measured Ron and Coff values, and therefore the operating characteristics of the RF switch can, in theory, be improved by way of adjusting the NMOS configurations to reduce one or both Ron and Coff values. That is, reducing the Ron value would allow more of the RF signal to travel through the RF switch when turned on, and reducing the Coff value would prevent more of the RF signal from traveling through the switch when turned off.

Conventional techniques for reducing Coff in RF SOI devices include the use of air gaps, which are gas-filled void regions that are intentionally introduced into a semiconductor structure. Air gaps have been used in semiconductor industry for reduction of inter-layer and intra-layer capacitance for many years. For example, U.S. Pat. No. 6,211,561 (Bin Zhao, 2001) describes patterning of voids in a dielectric layer deposited over a first level of interconnect lines, followed by deposition of a sealing layer over the voids, and then the deposition and patterning of a second level of interconnect lines. More recently, air gaps have been utilized to reduce Coff in RF SOI switches by way of displacing intermetal dielectric materials in regions over the switch's FET-type NMOS transistors, whereby capacitive coupling between the transistor' source and drain regions is reduced by way of replacing dielectric material higher dielectric constant values with air or another gas having a lower dielectric constant.

Conventional techniques for reducing Ron in RF SOI devices include the use of stressing layers (stressors), which typically comprise a dielectric layer that is disposed over the NMOS transistors' gate structures and intentionally fabricated to include a high residual tensile stress. Stressing layers function to reduce Ron in RF SOI devices by way of generating tensile mechanical stresses in the NMOS transistors' channel regions, thereby enhancing electron migration during operation.

Although air gaps and stressors may be utilized to respectively reduce an RF SOI device's Coff and Ron values, these two conventional techniques have proven to be incompatible when generated using conventional techniques. For example, FIGS. 13A and 13B are graphs respectively depict exemplary off-state capacitance values and exemplary on-state resistance values for RF SOI switches including inter-metal air gaps and a 1200 Angstrom thick SiN stressing layer that are generated using conventional fabrication methods. FIG. 13A indicates that the combined use of air gaps and stressing layers significantly reduces the Coff value of RF SOI switches (i.e., in comparison to the zero-air-gap-width Coff value) by way of reducing off-state capacitance, and that the Coff value decreases in direct proportion to the air gap trench width. However, FIG. 13B indicates that the combined use of air gaps and stressing layers causes an increase in Ron (i.e., in comparison to the zero-air-gap-width Coff value), and that the Ron value further increases in relation to the air gap trench width. Therefore, because the decrease in Coff is effectively offset by a corresponding increase in Ron, conventional RF SOI switches do not include both conventional air gaps and conventional stressors.

What are needed are methods for improving the operating characteristics (e.g., Coff·Ron) of RF SOI devices. What is particularly needed are fabrication methods and associated RF SOI device structures that facilitate the combined use of both air gaps and stressors to reduce both Coff and Ron in an RF SOI device.

SUMMARY OF THE INVENTION

The present invention is directed to RF SOI devices and associated fabrication methods including a novel triple-layer stressing stack and low-dielectric-constant (low-k) features that combine to provide the RF SOI device with enhanced operating characteristics (e.g., the Figure of Merit (FOM) of NMOS transistors utilized in RF SOI antenna switches) that cannot be achieved using conventional methods. The novel triple-layer stressing stack includes a stressor (lower dielectric) layer that applies tensile mechanical stresses in the NMOS transistors' channel regions, thereby decreasing on-state channel resistance (Ron) by way of enhancing electron mobility in the channel regions. The novel low dielectric constant (low-k) features are respectively disposed over the gate structure of an associated NMOS transistor, and function to reduce the capacitance across the NMOS transistors by way of replacing higher-k pre-metal dielectric material with lower-k material and/or an air gap region (i.e., gas-filled or vacuum-filled void region), thereby decreasing each NMOS transistor's off-state capacitance (Coff). The inventors determined that Ron deterioration in RF SOI devices that include both air gaps and stressors produced by conventional methods is caused by partial etching of the thick stressing layer during subsequent formation of the air gap regions. To address this problem, the novel triple-layer stressing stack includes an intermediate buffer layer and an upper etch-stop (upper dielectric) layer that collectively facilitate the formation of wide air gap regions to generate a maximum decrease in Coff, and to protect the stressor layer during formation of the air gap regions in order to maintain a maximum decrease in Ron. That is, the buffer and etch-stop layers provide a maximum decrease in Coff by way of facilitating the use of a special etching process to form the low-k features such that their lowermost boundaries are disposed inside the triple-layer stressing stack, thereby ensuring the reliable displacement of all higher-k dielectric material from the region located directly over the NMOS transistor gate structures. The buffer and etch-stop layers also function to reliably prevent damage to the stressor layer during the special etching process, thereby facilitating a maximum decrease in Ron by way of maintaining the high tensile mechanical stresses that are generated in the NMOS transistors' channel regions by a residual tensile stress level of the stressor layer. Accordingly, RF SOI devices that implement the novel triple-layer stressing stack and low-k features according to the present invention exhibit improved operating characteristics in comparison to conventional devices.

According to a specific embodiment, the present invention is directed to a method for fabricating RF devices on an SOI substrate that begins by forming one or more conventional NMOS transistors (e.g., including n-doped source/drain regions disposed in the SOI substrate's device layer and separated by a channel region, and including a polycrystalline silicon (polysilicon) gate structure disposed on a gate oxide layer over the channel region). Respective silicide structures are then formed using known techniques on the source/drain regions, and over the polysilicon gate structure of each NMOS transistor. The triple-layer stressing stack is then produced by forming the stressor (lower dielectric) layer over the silicide structures, then forming the intermediate buffer layer on an upper surface of the stressor layer, and then forming the upper dielectric layer on an upper surface of the intermediate buffer layer. A standard pre-metal (first) dielectric layer is then formed on the triple-layer stressing stack and patterned using known pre-metal processing techniques to provide periodically spaced metal contact/via structures that extend vertically through the dielectric layer and contact corresponding silicide structures formed on the source/drain regions. Metal-1 interconnect lines are then formed on an upper surface of the pre-metal dielectric (PMD) layer that are operably connected to upper ends of corresponding metal contact/via structures. A second etching process (i.e., in addition to the pre-metal etch) is then performed to define an air gap (i.e., air-filled void) region over each polysilicon gate structure by removing corresponding portions of the pre-metal dielectric layer. According to an aspect of the invention, the special etching process is performed using etchant materials and/or processes that are designed to selectively etch (remove) the material forming the upper etch-stop layer, but not remove the material forming the underlying buffer layer, whereby each air gap region has a lowermost boundary that is disposed inside the triple-layer stressing stack (i.e., either in the upper etch-stop layer or in the intermediate buffer layer). By forming the triple-layer stressing stack and the air-filled void region in accordance with this method, the upper etch-stop layer effectively serves as a sacrificial structure that facilitates the removal of all pre-metal dielectric material located above the polysilicon gate structures, thereby maximizing the Coff reduction benefits of the subsequently formed low-k features. In addition, the intermediate buffer layer serves as a back-up etch stop layer that simplifies the special etching process (i.e., allows over-etching to ensure removal of pre-metal dielectric material without risking damage to the stressor layer, which could result in an undesirable increase in Ron by way of reducing the tensile mechanical stress generated by the stressor layer in the NMOS channel regions). Accordingly, the present invention facilitates the production of RF SOI devices that exhibit decreased Coff (i.e., in comparison to devices that do not include air gaps) by way of providing low-k features over the NMOS gate structures, and also exhibit decreased Ron by way of reliably preventing damage to the stressor layer, thereby enhancing electron mobility in the NMOS channel regions.

According to an aspect of the present invention, each RF SOI device formed in accordance with the present invention differs from conventional FET-type RF SOI devices in that (a) the triple-layer stressing stack described above is formed over the device's NMOS transistors, (b) portions of the standard dielectric material located vertically above the NMOS' polysilicon gate structures is occupied by corresponding low-k features (e.g., gas-filled, vacuum-filled or polymer-filled regions having a lower dielectric constant than the displaced dielectric material), and (c) the lowermost boundary of each low-k feature is located in either the upper etch-stop layer or the intermediate buffer layer (i.e., the low-k features do not extend through the intermediate buffer layer into the stressor layer). By replacing the portions of the standard, higher-k dielectric material (e.g., $SiO_2$) that would otherwise be disposed between the metal lines and the polysilicon gate structures with the low-k features, the present invention provides significant improvement in an RF SOI device's operating characteristics by way of reducing capacitive coupling between adjacent metal line structures and/or capacitive coupling between the metal line structures and the polysilicon gate structures. Moreover, providing the intermediate buffer layer between the upper etch-stop layer and the stressor layer facilitates the reliable generation of optimal low-k features that minimize Coff while also minimizing Ron by preventing damage to the stressor layer, thereby providing the RF SOI device with improved operating characteristics.

According to a presently preferred embodiment, the stressor (lower dielectric) layer of the triple-layer stressing stack is formed with a first residual tensile stress level that generates the desired tensile mechanical stress in the channel region, the intermediate buffer layer is formed using a thin oxide layer, and then the upper dielectric layer is produced with a second residual tensile stress level that is substantially lower than the first residual tensile stress level of the stressor layer. In one embodiment, the higher residual tensile stress level of the stressor layer is generated by depositing a selected dielectric material using processing techniques known in the art (e.g., by depositing SiN while varying reaction chamber parameters, such as temperature or pressure, to generate a significant residual tensile stress in the resulting SiN film, which forms the stressor layer). In contrast, the upper etch-stop layer is formed by depositing a selected dielectric material while maintaining all process parameters constant throughout the deposition process (i.e., such that upper dielectric layer includes the desired lower residual tensile stress level). Forming the upper dielectric layer with a substantially lower residual tensile stress level further achieves the objective of maintaining/maximizing the desired decrease in Ron by way of preventing the possible transmission of stress forces released by the upper dielectric layer during the special etching process that can damage to stressor layer.

BRIEF DESCRIPTION OF THE DRAWINGS

These and other features, aspects and advantages of the present invention presented in the following description, appended claims, and accompanying drawings, where:

FIGS. 6A, 6B, 6C and 6D are partial cross-sectional side views depicting the formation of air-gap-type low-k features in accordance with the method of FIG. 2 according to an exemplary embodiment of the present invention;

FIG. 7 is a partial cross-sectional side view depicting the formation of an optional capping layer according to another exemplary embodiment of the present invention;

FIG. 8 is a partial cross-sectional side view depicting the formation of optional second metal structures according to another exemplary embodiment of the present invention;

DETAILED DESCRIPTION OF THE DRAWINGS

The present invention relates to an improved method for fabricating RF SOI devices having enhanced operating characteristics, and the following description is presented to enable one of ordinary skill in the art to produce RF SOI devices using the improved method. As used herein, directional terms such as "upper", "upward", "above", "lower", "downward", "below", "horizontal" and "vertical are intended to provide relative positions for purposes of description and are not intended to designate an absolute frame of reference. In addition, the term "integral" is used herein to describe the connective relationship between two portions of a single simultaneously formed structure and is distinguished from the terms "connected" or "coupled", which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the embodiments shown and described but is to be accorded the widest scope consistent with the principles and novel features herein disclosed.

Figure 1:
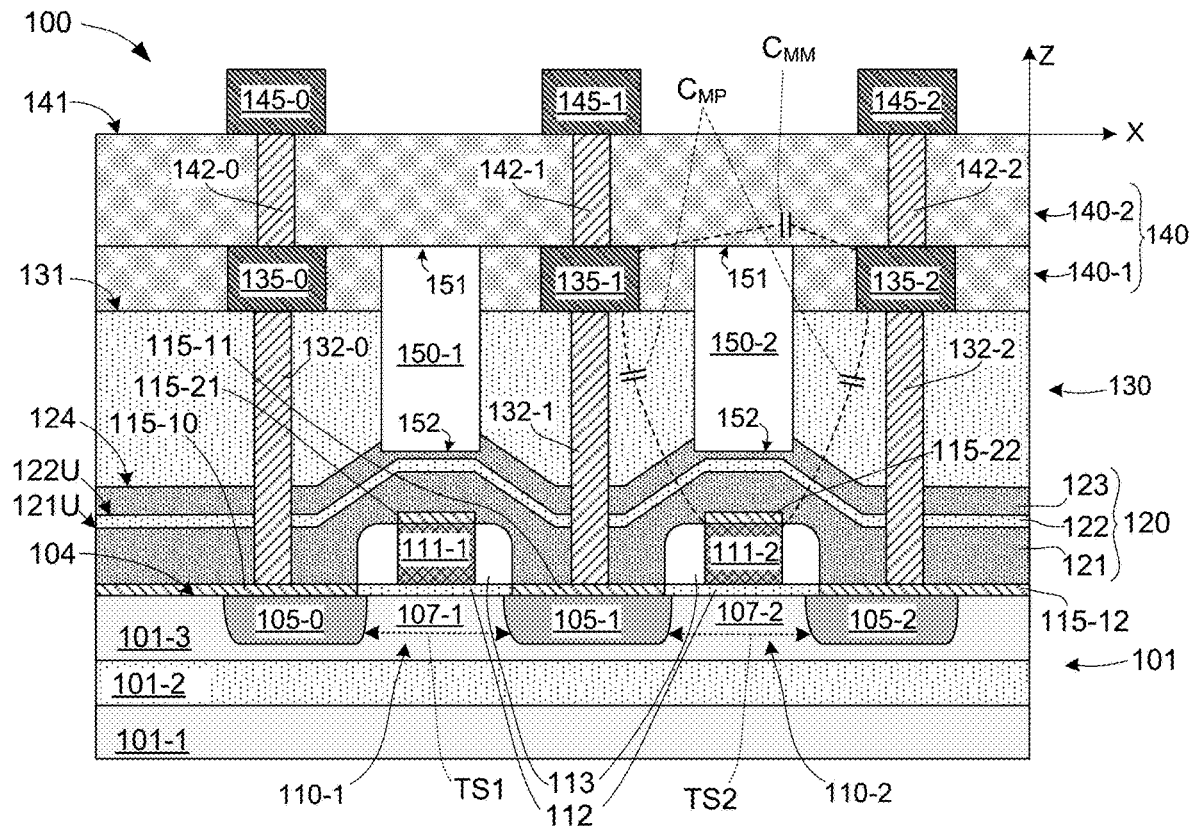
FIG. 1 is a cross-sectional side view showing a simplified RF SOI device including a triple-layer stressing stack and air-gap-type low-k features according to an exemplary embodiment of the present invention.
Figure 2:
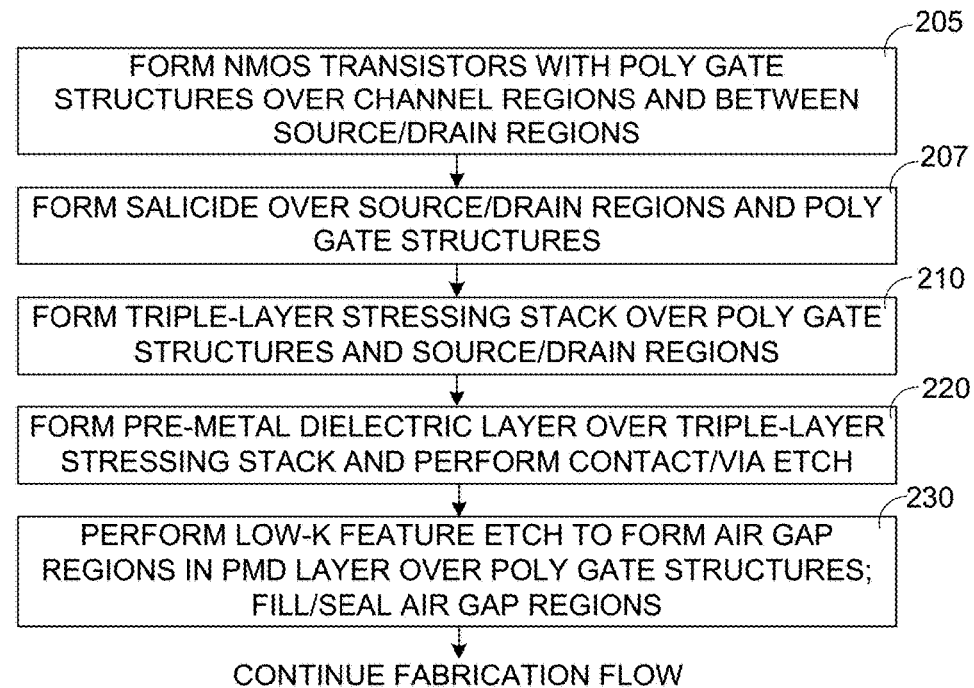
FIG. 2 is a flow diagram showing a generalized methodology for producing the RF SOI device of FIG. 1 according to another embodiment of the present invention.

FIG. 1 is a cross-sectional view showing a simplified field-effect-transistor-type (FET-type) RF SOI device 100 according to an exemplary embodiment of the present invention, and FIG. 2 is a flow diagram showing a generalized methodology that may be used to produce RF SOI device 100.

Referring to the lower portion of FIG. 1, RF SOI device 100 is formed on a device layer 101-3 of an SOI substrate 101. SOI substrate 101 includes an optional bottommost "handler" wafer 101-1, a buried oxide (BOX) insulator layer 101-2, and a topmost silicon device layer that is typically separated using known techniques into electrically isolated silicon islands (pads). RF SOI device 100 includes two NMOS transistors 110-1 and 110-2 that are formed in and over an upper surface 104 of device layer 101-3. In practical embodiments, other circuit elements (e.g., additional NMOS transistors) of RF SOI device 100 are formed on device layer 101-3, and other circuitry (e.g., functional circuitry of an SOC device that includes RF device 100, not shown) are formed on the other device layer portions of SOI substrate 101, and are operably coupled to device 100 by way of metal line structures such as those mentioned below.

FET-type RF SOI device 100 includes one or more NMOS transistors formed on device layer 101-3 by way of a selected fabrication process. In the exemplary embodiment, device 100 is depicted as including two NMOS transistors 110-1 and 110-2 but may include any number of NMOS transistors formed in the manner described below. NMOS transistors 110-1 and 110-2 utilize three elongated n-doped source/drain regions 105-1, 105-2 and 105-3 that are disposed in device layer 101-3 and separated by intervening p-type channel regions 107-1 and 107-2, with an elongated polysilicon gate structure 111-1 of NMOS transistor 110-1 disposed over channel region 107-1 and an elongated polysilicon gate structure 111-2 of NMOS transistor 110-2 disposed over channel region 107-2. As used herein, the adjective "elongated" indicates that widths of the associated structures/regions are proportionally longer than the depicted lengths of the associated structures/regions, where length denotes a horizontal X-axis distance (parallel to the drawing sheet plane), and width denotes a horizontal Y-axis distance (i.e., extending perpendicularly into the drawing sheet plane). In the exemplary embodiment, NMOS transistors 110-1 and 110-2 share source/drain region 105-2 using a configuration typically utilized by conventional FET-type RF SOI switches, but in other embodiments source/drain regions region 105-2 in other embodiments. Gate structures 111-1 and 111-2 are separated from upper surface 104 of device layer 101-3 by respective gate oxide layers 112, and sidewall spacers 113 are formed on the side edges of gate structures 111-1 and 111-2. Silicide structures 115-10, 115-11 and 115-12 are respectively disposed on upper surface 104 of device layer 101-3 over source/drain regions 105-1, 105-2 and 105-3, and silicide structures 115-21 and 115-22 are respectively disposed on upper surfaces of gate structures 111-1 and 111-2. In an exemplary embodiment, all these silicide structures comprise nickel monosilicide (NiSi) that is formed using known techniques.

According to a first aspect of the present invention, RF SOI device 100 includes a triple-layer stressing structure 120 that extends over NMOS transistors 110-1 and 110-2, and includes a stressor (lower dielectric) layer 121, an intermediate buffer layer 122, and an upper etch stop (upper dielectric) layer 123. Stressor layer 121 includes a relatively thick dielectric material (e.g., Silicon Nitride) that is fabricated using known techniques such that stressor layer 121 has a (first) residual tensile stress level RS1 that generates tensile mechanical stresses TS1 and TS2 that enhance electron mobility in channel regions 107-1 and 107-2, respectively. Intermediate buffer layer 122 is disposed on an entirety of an upper surface 121U of lower dielectric layer 121, and includes a relatively thin oxide material (e.g., $SiO_2$). Upper etch stop 123 includes a relatively thin layer of dielectric material (e.g., Silicon Nitride) that is disposed on an entirety of an upper surface 122U of intermediate buffer layer 122. Unlike stressor layer 121, upper etch-stop layer 123 is fabricated using known techniques such that upper etch-stop layer 123 has a relatively low (second) residual tensile stress level RS2 that generates very little or zero tensile mechanical stress in device layer 101-3 (i.e., residual tensile stress level RS2 is substantially lower than residual tensile stress level RS1). With this configuration, upper etch-stop layer 123 serves as a sacrificial etch-stop structure that prevents damage to the lower dielectric layer 121 during the formation of low-k features (discussed below), thereby maintaining (i.e., prevent significant reduction of) tensile mechanical stresses TS1 and TS2, resulting in reduced Ron by way of enhancing electron mobility through channel regions 107-1 and 107-2 during operation of NMOS transistors 110-1 and 110-2. In addition, in this configuration, intermediate buffer layer 122 serves as a buffer that prevents the possible transmission of the etchant utilized to generate the low-k features (described below) and/or stress generated during the special etching process from passing into lower dielectric layer 121, thereby further ensuring maintenance of high tensile mechanical stresses TS1 and TS2 in channel regions 107-1 and 107-2.

A modified back-end process is then performed to dielectric layers and metal interconnect structures are formed over and through triple-layer stressing stack 120 to provide electrical connections for carrying electrical signals between NMOS transistors 110-1 and 110-2 and other circuitry (not shown) of RF SOI device 100. In the example of FIG. 1, a pre-metal dielectric (PMD) layer 130 is formed on upper surface 124 of triple-layer stressing stack 120, and an intermetal (second) dielectric layer 140 is disposed over an upper surface 131 of PMD layer 130. Dielectric layers 130 and 140 are formed using conventional methods and comprise one or more dielectric materials (e.g. $SiO_2$) having a relatively high (first) dielectric constant (i.e., higher than dielectric constants associated with low-k features 150-1 and 150-2, discussed below). After PMD layer 130 is formed, back-end processing is used to form periodically spaced metal contact/via structures 132-0, 132-1 and 132-2 that extend vertically through PMD layer 130 and through corresponding portions of triple-layer stressing stack 120 to provide electrical connections to source/drain regions 105-0, 105-1 and 105-2, respectively. A first portion 140-1 of intermetal dielectric layer 140 is then formed over PMD layer 130. Metal-1 (metal) interconnect lines 135-0, 135-1 and 135-2 are then formed in trenches that are patterned into intermetal dielectric layer portion 140-1 and over portions of upper surface 131 of PMD layer 130 such that each Metal-1 interconnect line extends horizontally (i.e., parallel to elongated polysilicon gate structures 111-1 and 111-2) and is electrically connected to a corresponding source/drain region 105-0, 105-1 and 105-2 by way of periodically spaced groups of metal contact/via structures. For example, metal interconnect line 135-0 is connected to source/drain region 105-0 by way of multiple metal contact/via structures 132-0 (one shown), which are periodically spaced in the Y-+axis direction, and which are electrically connected to source/drain region 105-0 by way by way of corresponding portions of silicide structure 115-10. A special etching process (described below) is then utilized to form voids through intermetal dielectric layer portion 140-1 and PMD layer 130. Subsequent back-end processing is performed using known techniques to provide a second portion 140-2 of intermetal dielectric layer 140 and electrical connections to the Metal-1 structures. For example, metal via structures 142-0, 142-1 and 142-2 are formed through second dielectric layer portion 140-2 to provide electrical connections to Metal-1 interconnect lines 135-0, 135-1 and 135-2, and then Metal-2 interconnect lines 145-0, 145-1 and 145-2 are formed on upper surface 141 of second intermetal dielectric layer portion 140-2. Additional back-end processing is performed in accordance with known techniques to complete the fabrication of RF SOI device 100. Note that the interconnect structure configuration depicted in FIG. 1 is provided to illustrate generalized Metal-1 and Metal-2 structures; that is, the depicted structures are not intended to represent a practical interconnect configuration.

According to another aspect of the present invention, RF SOI switch 100 includes low-k features 150-1 and 150-2 disposed in PMD layer 130 and located over polysilicon gate structures 111-1 and 111-2, respectively. Each low-k feature 150-1 and 150-2 comprises either one or more low-dielectric constant materials, an air-gap region (i.e., a vacuum- or gas-filled void), or a combination thereof that displaces a corresponding volumetric region of PMD layer 130, and has a relatively low (second) dielectric constant (i.e., in comparison to the relatively high (first) dielectric constant of the dielectric material forming PMD layer 130). Each low-k feature 150-1 and 150-2 extends vertically downward from an upper boundary 151, which is positioned above upper surface 131, through PMD layer 130 and into a corresponding portion of upper etch-stop layer 123 (i.e., such that a lower boundary 152 of each low-k feature 150-1 and 150-2 is disposed either in upper etch-stop layer 123 or in intermediate buffer layer 122). Note that low-k features 150-1 and 150-2 are positioned between associated pairs of metal via/contact structures and Metal-1 lines. For example, low-k feature 150-1 is disposed between via/contact structures 132-0 and 132-1, and between Metal-1 interconnect lines 135-0 and 135-1.

FIG. 2 is a flow diagram showing a generalized methodology for producing RF SOI devices (e.g., device 100 shown in FIG. 1), and FIGS. 3 to 10 depict the processes of FIG. 2 in additional detail. That is, the methodology of FIG. 2 begins with the formation of NMOS transistors (block 205) and the formation of silicide structures (block 207), which are described in additional detail below with respect to FIG. 3. A triple-layer stressing stack is then formed over the NMOS transistors (block 210), as described in additional detail below with reference to FIGS. 4A to 4C. A pre-metal dielectric layer and Metal-1 structures are then formed using an associated standard (first) etching process (block 220), as described in additional detail below with reference to FIGS. 5A to 5C. Low-k features are subsequently formed (block 230) using a special (second) etching process that is used to form air-gap regions (air-filled voids) that extend through the pre-metal dielectric layer and into the triple-layer stressing stack, as described in detail with reference to FIGS. 6A to 6C, and then formation of the low-k features is completed by filling and/or sealing the air-gap regions, as described in detail with reference to FIG. 6D. Additional dielectric material is then deposited and patterned to further protect the low-k features and/or to facilitate the formation of subsequent (e.g., Metal-2) interconnect structures, as described with reference to FIGS. 7 and 8.

Figure 3:
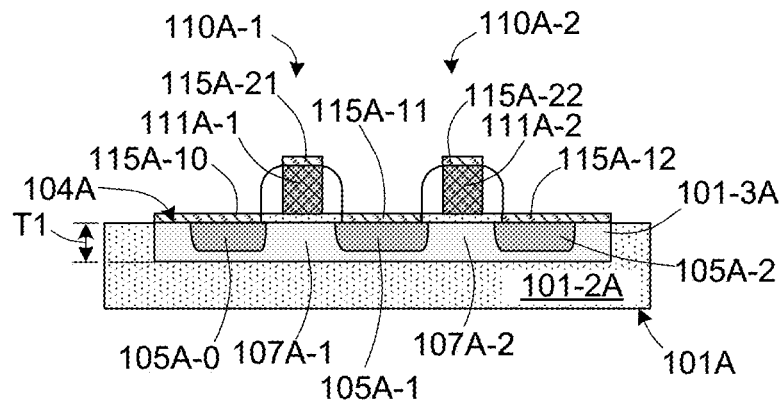
FIG. 3 is a partial cross-sectional side view depicting the formation of one or more NMOS transistor in accordance with the method of FIG. 2 according to an exemplary embodiment of the present invention.

Referring to block 205 of FIG. 2, and referencing the structures shown in FIG. 3, the production of an RF SOI device begins by performing front-end processes of an established CMOS, BiCMOS or RF MEMS fabrication flow to form NMOS transistors 110A-1 and 110A-2 in and on a silicon island 101A-3. Silicon island 101A-3 comprises a portion of the device layer of SOI substrate 101A that is electrically isolated from other islands/portions (not shown) of the device layer by way of etching or otherwise patterning the device layer using known techniques, and by forming oxide material in the resulting gaps surrounding the peripheral side edges of silicon island 101A-3. In one embodiment, silicon island 101A-3 comprises a portion of a p-type silicon device layer having a doping concentration in the range of $1\times10^{14}$ to $1\times10^{17}$ atoms per cubic centimeter (preferably $1\times10^{15}$ atoms per cubic centimeter) and having a thickness T1 in the range of 200 Angstroms to 2000 Angstroms. The formation of NMOS transistors 110A-1 and 110A-2 generally includes performing optional STI isolation, gate oxidation, polysilicon deposition and patterning, sidewall spacer deposition and etch back, and then performing an n-type dopant implant to form spaced-apart source/drain regions 105A-0 to 105A-2 separated by p-doped channel regions 107A-1 and 107A-2.

Referring to block 207 of FIG. 2, silicide structures are then formed on the gate structures and on upper surface portions of the device layer over the source/drain regions of each NMOS transistor. Referring to FIG. 3, in a presently preferred embodiment, self-aligned silicide (salicide) structures 115A-10 to 115A-12 are formed on corresponding portions of upper surface 104A over source/drain regions 105A-0 to 105A-2, respectively, and salicide structures 115A-21 and 115A-22 are formed upper surfaces of polysilicon gate structures 111A-1 and 111A-2, respectively, using known techniques.

Referring to block 210 of FIG. 2, a triple-layer stressing stack 120 is formed over the polysilicon gate structures 111-1 and 111-2 after silicide formation. Formation of triple-layer stressing stack 120 is described in accordance with an exemplary specific embodiment with reference to FIGS. 4A to 4C, where FIG. 4A depicts the formation of an exemplary stressor (lower dielectric) layer 121A, FIG. 4B depicts the formation of an exemplary intermediate buffer layer 122A, and FIG. 4C depicts the formation of an exemplary upper etch-stop layer 123A.

Figure 4A:
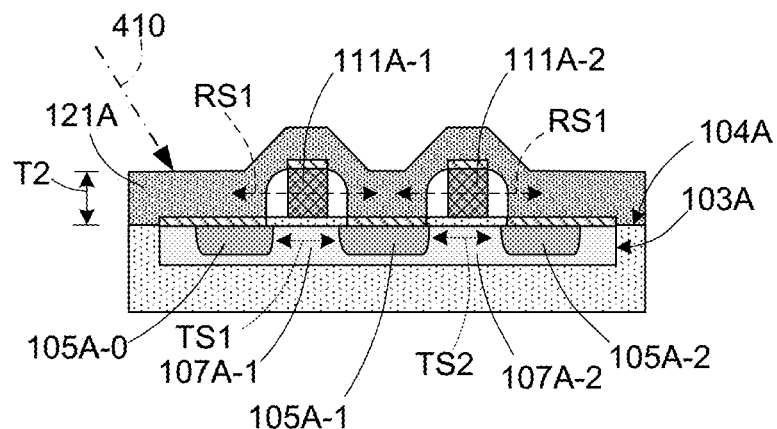
FIGS. 4A, 4B and 4C are partial cross-sectional side views depicting the formation of a triple-layer stressing stack in accordance with the method of FIG. 2 according to an exemplary embodiment of the present invention.

Referring to FIG. 4A, forming stressor (lower dielectric) layer 121A includes depositing a dielectric material 410 (e.g., one of Silicon Nitride (SiN) and Oxynitride) over polysilicon gate structures 111A-1 and 111A-2, and over source/drain regions 105A-0 to 105A-2 (e.g., on the salicide films that are formed on upper surface 104A and over gate structures 111A-1 and 111A-2). As mentioned above, stressor layer 121A involves depositing dielectric material 410 using process parameters that cause the deposited dielectric material to have a (first) residual tensile stress level RS1 in the range of 0.5 GPa to 2 GPa or greater that generates a tensile mechanical stress TS1 in channel region 107A-1 and a tensile mechanical stress TS2 in channel region 107A-2, where stresses TS1 and TS2 are 0.5 to 2 GPa or greater. In an exemplary specific embodiment, forming stressor layer 121A includes by depositing a layer of SiN having a thickness T2 in the range of 500 Angstroms to 2000 Angstroms.

Figure 4B:
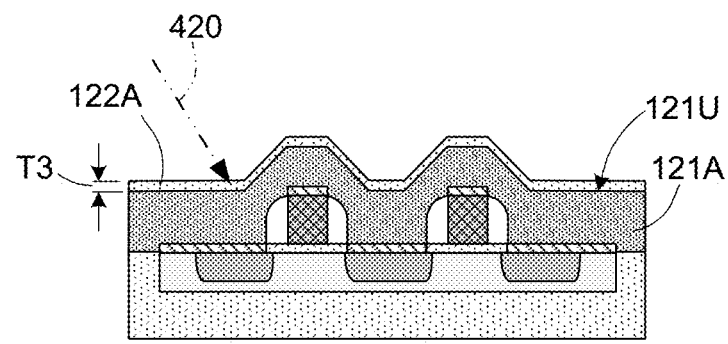

Referring to FIG. 4B, intermediate buffer layer 122A is then formed on upper surface 121U of stressor layer 121A. In a presently preferred embodiment, forming intermediate buffer layer 122A includes depositing a layer of oxide material 420 (e.g., silicon dioxide ($SiO_2$)) having a thickness T3 in the range of 10 Angstroms to 600 Angstroms. In addition to serving as a second etch-stop layer (i.e., in addition to upper etch-stop layer 123A), intermediate buffer layer 122A may also serve as a stress buffer layer in order to eliminate adverse influence of stress forces generated by upper etch-stop layer 123A on stressor (lower dielectric) layer 121A.

Figure 4C:
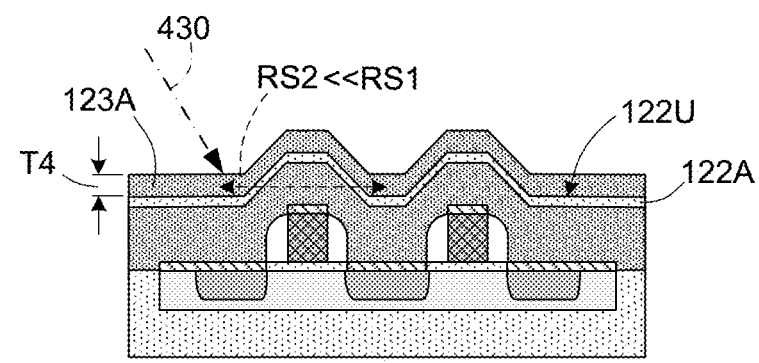

Referring to FIG. 4C, upper etch-stop layer 123A is then formed on upper surface 122U of intermediate buffer layer 122A. In alternative exemplary embodiments, forming upper etch-stop layer 123A includes depositing a dielectric material 430 (e.g., SiN or a-SiC:H (SiC BLOk™)) material such that upper etch-stop layer 123A has a second residual tensile stress level RS2 that is substantially lower than first residual tensile stress level RS1. In a presently preferred embodiment, the formation of upper etch-stop layer 123A includes depositing a layer of SiN having a thickness T4 in the range of 100 Angstroms to 600 Angstroms.

Table 1 (below) provides additional process details utilized in accordance with the exemplary embodiment described above with reference to FIGS. 4A to 4C.

TABLE 1

| Layer | Purpose | Deposition conditions | Thickness, A |
|---|---|---|---|
| 121A | Thick SiN layer | SiH4:NH3:N2 flow ratio: 1:2:750, Pressure: 5-15 Torr, HF RF Power: 50-100 Watt, Temperature: 450-550° C. | 1200 |
| 122A | Thin SiO2 | TEOS: 100-500 milligram per minute O2: 500-1500 standard cubic centimeters per minute (sccm) HE-CAR: 500-1500 scc Pressure: 5-15 Torr, HF RF Power: 480-570 Watt, Temperature: 400° C. | 100-600 |
| 123A | Thin SiN | SiH4:NH3:N2 flow ratio: 1:2:70, Pressure: 3-7 Torr, HF RF Power: 475-575 Watt, Temperature: 400-500° C. | 100-600 |

Figure 5A:
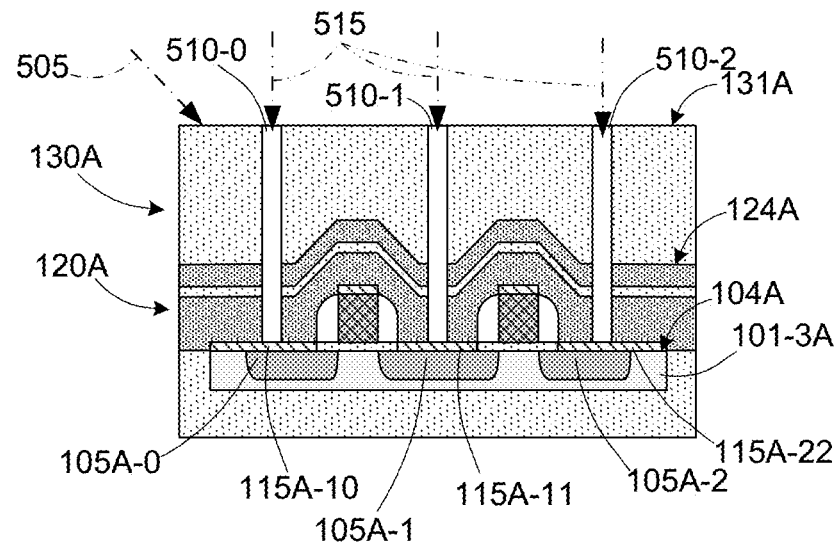
FIGS. 5A and 5B are partial cross-sectional side views depicting the formation of a dielectric layer and first metal structures in accordance with the method of FIG. 2 according to an exemplary embodiment of the present invention.
Figure 5B:
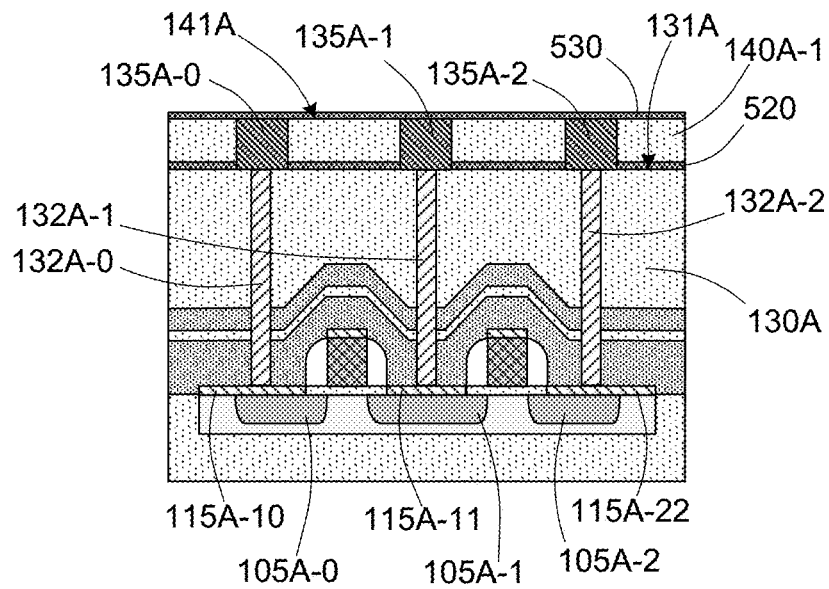

Referring to block 220 of FIG. 2, a PMD layer is then formed and processed using known techniques to provide contact structures and Metal-1 interconnect lines. FIGS. 5A and 5B depict an exemplary specific embodiment including the formation and processing of a PMD layer 130A in a manner consistent with block 220 of FIG. 1.

FIG. 5A depicts the formation of a PMD layer 130A by way of depositing a standard PMD dielectric material 505 over upper surface 124 of triple-layer stressing stack 120A using known techniques. FIG. 5A also depicts the performance of a substantially standard (first) contact/via etching process during which one more suitable etchants 515 and associated masks (not shown) are utilized to form openings 510-0 to 510-2 that extend through PMD layer 130A and triple-layer stressing stack 120A to salicide structures 115A-0 to 115A-2 (i.e., to facilitate electrical connection to portions of upper surface 104A of silicon island 101A-3 that are located over source/drain regions 105A-0, 105A-1 and 105A-2).

FIG. 5B depicts a subsequent point during back-end processing after periodically spaced metal contact/via structures 132A-0 to 132A-2 are respectively formed in openings 510-0 to 510-2 (shown in FIG. 5A) using known techniques such that contact/via structures 132A-0 to 132A-2 extend vertically through PMD layer 130A and contact corresponding silicide structures 115A-10 to 115A-12, respectively. Note that upper ends of contact/via structures 132A-0 to 132A-2 are located at upper surface 131A of PMD layer 130A.

FIG. 5B also depicts the subsequent formation of copper (single damascene) Metal-1 interconnect lines 135A-0 to 135A-2 over PMD layer 130A according to an exemplary embodiment. In this case, a lower (first) etch-stop layer 520 (e.g., plasma enhanced nitride (PEN)) is formed on upper surface 131A of dielectric layer 130A, then a (second) dielectric layer 140A-1 (e.g., SiO) is formed over lower etch-stop layer 520. A Metal-1 mask material is then deposited and patterned over an upper surface 141A-1 of dielectric layer 140A-1, and a Metal-1 etch is performed to form trenches extending through exposed portions of dielectric layer 140A-1 and underlying portions of lower etch-stop layer 520, thereby exposing corresponding portions of upper surface 131A that include the upper ends of contact/via structures 132A-0 to 132A-2. The trenches are then filled with Cu, and excess Cu is then removed by chemical mechanical polishing (CMP), whereby upper surfaces of Metal-1 interconnect lines 135A-0 to 135A-2 are made substantially coplanar with adjacent upper surface portions of dielectric layer 140A-1. Finally, an upper (second) etch-stop layer 530 (e.g., PEN) is formed over exposed portions of upper surface 141A of dielectric layer 140A-1 and over Metal-1 interconnect lines 135A-0 to 135A-2. In an alternative embodiment (not shown), Metal-1 interconnect lines 135A-0 to 135A-2 are formed using aluminum technology instead of damascene (copper) technology, whereby the Metal-1 process is similar to that described with reference to FIGS. 5A and 5B, but etch-stop layers 520 and 530 may be omitted (e.g., as depicted in FIG. 1) and are thereby optional to the formation of Metal-1 structures.

Referring to block 230 of FIG. 2, low-k features are then formed by way of a special low-k feature (second) etching process that is utilized to form air gap regions (air-filled voids) extending through PMD layer 130A and into triple-layer stressing stack 120A, followed by an optional process of filling the air gap regions with a low-k material (e.g., a polymer), and then the formation of a sealing layer that encloses the thus-formed low-k features. In a presently preferred embodiment, the low-k feature etching process is performed after Cu CMP in damascene technology and after dielectric CMP in Al technology, and involves three etches (sub-processes) including an isotropic dry etch and two anisotropic dry etches, which are described below with reference to FIGS. 6A to 6C. The completion of exemplary void-type low-k features is then described with reference to FIG. 6D. Note that the completion of exemplary filled-type low-k features is described below with reference to FIGS. 9 and 10.

Figure 6A:
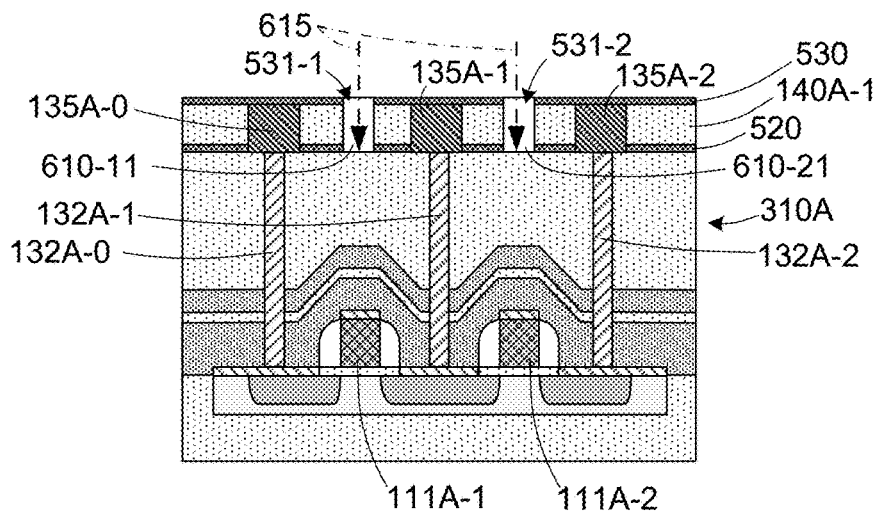

FIG. 6A depicts a first anisotropic dry etch (sub-process) of the low-k feature etching process. An anisotropic (first) etchant 615 and an associated mask (not shown) are used to remove portions of second dielectric layer 140A-1, thereby forming upper air gap sections 610-11 and 610-21 over polysilicon gates 111A-1 and 111A-2. Note that anisotropic etchant 615 also removes corresponding portions of optional etch-stop layers 520 and 530. That is, upper section 610-11 is formed by directing etchant 615 through a mask opening (not shown) that is positioned between metal interconnect lines 135A-0 and 135A-1 (i.e., between contact/via structures 132A-0 and 132A-1) to etch an opening 531-1 through upper PEN layer 530, to then remove a corresponding portion of dielectric layer 140A-1 below opening 531-1, and to then remove a corresponding portion of lower etch-stop layer 520. Similarly, upper section 610-11 is formed by directing etchant 615 to etch an opening 531-2 through upper PEN layer 530 between metal interconnect lines 135A-1 and 135A-2 (i.e., between contact/via structures 132A-1 and 132A-2), to then remove a corresponding portion of dielectric layer 140A-1 below opening 531-2, and to then remove a corresponding portion of lower etch-stop layer 520. Note that the formation of dielectric layer 140A-1 and PEN 530 before performing the low-k feature etching process ensures that upper boundaries of the subsequently formed low-k features are vertically located at levels equal to or above the upper edges of of Metal-1 interconnect lines 135A-0 to 135A-2. That is, the uppermost points of upper air gap sections 610-11 and 610-21 are defined by openings 531-1 and 531-2, which are formed in upper PEN layer 530, which in turn is disposed over the upper edges of Metal-1 interconnect lines 135A-0 to 135A-2.

Figure 6B:
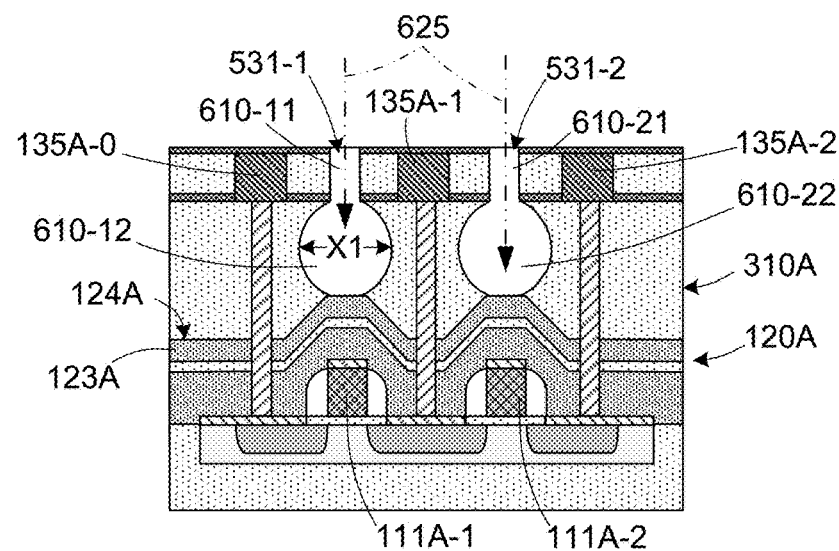

FIG. 6B depicts an isotropic dry (second) etch in which an isotropic (second) etchant 625 is utilized to remove portions of PMD layer 130A to form intermediate air gap sections 610-12 and 610-22 that extend from upper air gap sections 610-11 and 610-21, respectively, to corresponding regions of upper surface 104A of triple-layer stressing stack 120A. As depicted, the isotropic etchant 625 enters through upper air gap sections 610-11 and 610-21, and etches laterally into dielectric layer 310A such that intermediate air gap sections 610-12 and 610-22 extend laterally under Metal-1 interconnect lines 135A-0 to 135A-2. In one embodiment, the isotropic dry etch is performed such that intermediate air gap sections 610-12 and 610-22 are formed with horizontal dimensions X1 in the range of 0.16 Angstroms to 0.34 Angstroms. At the end of the isotropic etch, intermediate air gap sections 610-12 and 610-22 extend from openings 531-1 and 531-2 said first dielectric layer 130A to upper surface regions of upper etch-stop layer 123A that are located directly over polysilicon gates 111A-1 and 111A-2, respectively.

Figure 6C:
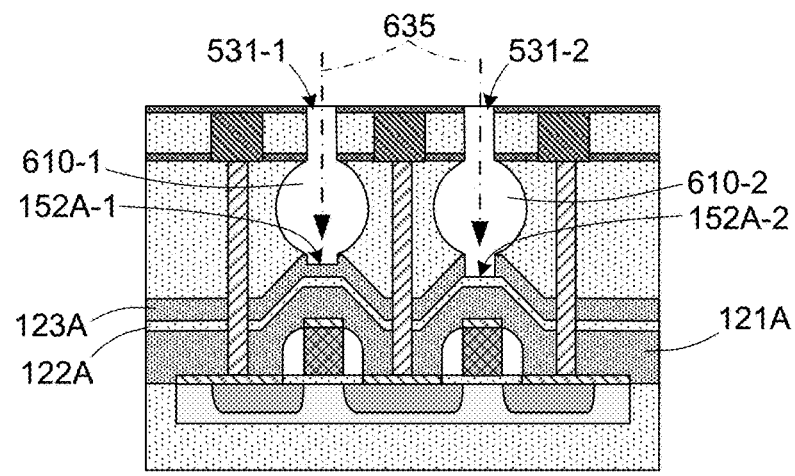

FIG. 6C depicts a soft over-etch (third) etching sub-process in which a third etchant 635 is utilized to remove portions of upper etch-stop layer 123A that are exposed by intermediate air gap sections 610-12 and 610-22, respectively, thereby completing the formation of air gap regions 610-1 and 610-2. According to a preferred embodiment, the soft over-etch process is performed such that the lower end portions of air gap regions 610-1 and 610-2 are disposed either in upper etch-stop layer 123A or in intermediate buffer layer 122A. For example, lower end portion 152A-1 of air gap region 610-1 is depicted as being disposed in upper etch-stop layer 123A, and lower end portion 152A-2 of air gap region 610-2 is depicted as being disposed in buffer layer 122A. Note that the soft over-etch process is performed such that air gap regions 610-1 and 610-2 do not extend into stressor layer 121A.

Table 2 (below) provides additional process details utilized in accordance with the exemplary dielectric and soft over-etch etching sub-processes described above with reference to FIGS. 6B and 6C.

TABLE 2

| Etch sub-process | Gas Flows, sccm | Chamber Pressure, mTorr | Bias, Volts | Bottom RF Power, W |
|---|---|---|---|---|
| Dielectric etch 625 | C4F8: 10 O2: 15 CH2F2: 12 Ar: 250 | 60 | 800 | 1250 |
| Soft over-etch 635 | C4F8: 11 O2: 8 CO: 200 Ar: 100 | 60 | 900 | 2200 |

FIG. 6D depicts subsequent processing to seal the upper openings of air gap regions 610-1 and 610-2, thereby completing the formation of void-type low-k features 150A-1 and 150A-2. In the depicted embodiment, a low-conformity dielectric material 640 (e.g., silane based USG (undoped silica glass or silane based plasma enhanced oxide), Black Diamond™ (low-k carbon doped silicon oxide), or SiC BLOk™ (a-SiC:H)) is deposited over upper PEN layer 530 under process conditions that cause low-conformity material 640 to form a low-conformity (third) dielectric layer 140A-2 that eventually closes off the upper openings of air gap regions 610-1 and 610-2, thereby forming upper boundaries 151A-1 and 151A-2 of void-type low-k features 150A-1 and 150A-2. Note that the low-conformity dielectric deposition process may cause small amounts of low-conformity material (e.g., portions 640-1) to form on the inside surfaces of air gap regions 610-1 and 610-2, but should cause a majority of void-type low-k features 150A-1 and 150A-2 to be occupied by air (or other gas) having a substantially lower dielectric constant than that of PMD layer 130A.

FIG. 7 depicts subsequent deposition of a dielectric material 710 to form a capping dielectric layer 140A-3 over low-conformity dielectric layer 140A-2, and FIG. 8 depicts substantially completed RF SOI device 100A after Metal-2 processing is completed to facilitate electrical connections to the Metal-1 structures. In one embodiment, dielectric material 710 comprises a low-moisture-penetration material (e.g., a dense oxide material, preferably silane-based) such that capping dielectric layer 140A-3 serves to protect the underlying low-k features from moisture penetration, and also to protect air gap regions 610-1 and 610-2 during the subsequent Metal-2 over-etch. Accordingly, RF SOI device 100A represents a simplified exemplary embodiment of the present invention including both triple-layer stressing stack 120A and void-type low-k features 150A-1 and 150A-2.

Figure 9:
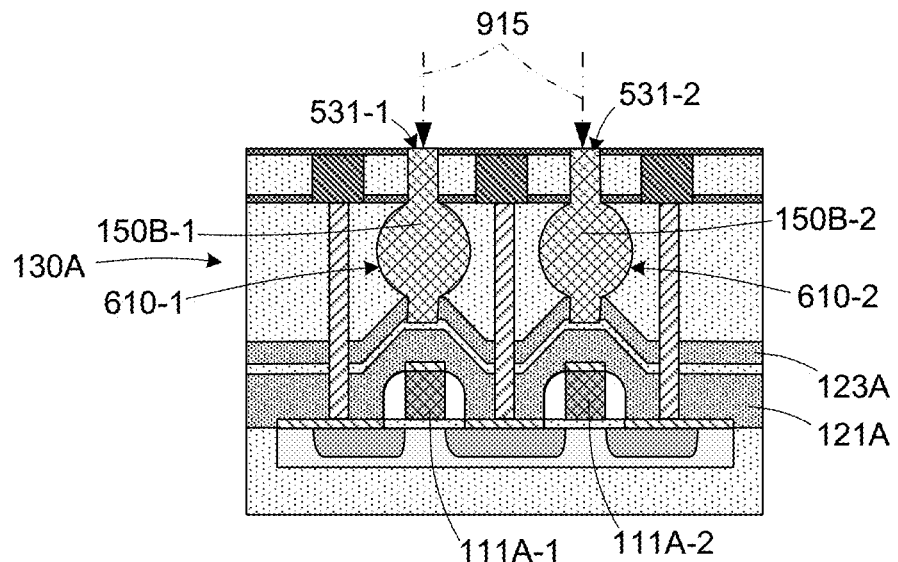
FIG. 9 is a partial cross-sectional side view depicting the formation of a filled-type low-k feature according to an alternative exemplary embodiment of the present invention.
Figure 10:
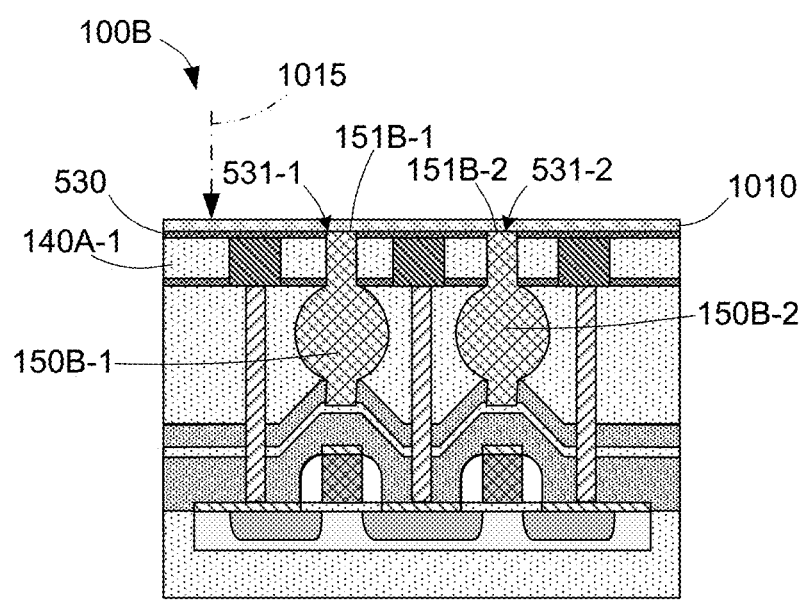
FIG. 10 is a partial cross-sectional side view depicting the formation of an optional SiC BLOk™ layer over the low-k features according to another embodiment of the present invention.

FIGS. 9 and 10 depict a method of fabricating an RF SOI device 100B including filled-type low-k features 510B-1 and 510B-2 according to an alternative embodiment of the present invention. The method utilizes the processes described above with reference to FIGS. 3 through 6C, including the first stage of forming low-k features 510B-1 and 510B-2 involving the execution of the low-k feature etching process to removed portions of PMD layer 130A and portions of etch-stop layer 123A without damaging the stressor layer 121A to form air gap regions 610-1 and 610-2 respectively located over polysilicon gate structures 111A-1 and 111A-2. Referring to FIG. 9, according to the present embodiment, a low-k material 915 (e.g., a carbon-doped silicon dioxide low-k material such as Black Diamond™, or a polymer such as polyimide, polynorbornene, benzocyclobutene or polytetrafluoroethylene (PTFE)) is then deposited through upper openings 531-1 and 531-2 such that it occupies (fills) air gap regions 610-1 and 610-2. As indicated in FIG. 10, an optional sealing material 1015 (e.g., SiC BLOk™ (a-SiC:H)) is then deposited over second dielectric layer 140A-1 (e.g., on an upper surface of upper PEN layer 530) such that sealing material 1015 forms a sealing layer 1010 that covers and seals upper openings 531-1 and 531-2, thereby establishing upper end portions 151B-1 and 151B-2 of filled-type low-k features 150B-1 and 150B-2, respectively. Subsequent dielectric deposition and Metal-2 processing are then performed as described above.

Figure 11:
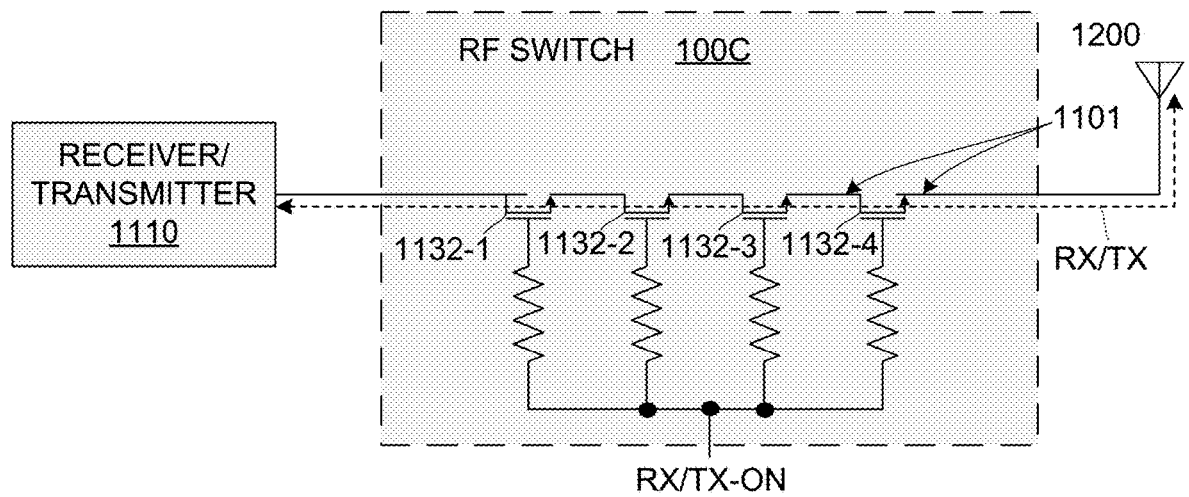
FIG. 11 is a simplified circuit diagram depicting an RF SOI switch including a triple-layer stressing stack and air-gap-type low-k features according to a specific embodiment of the present invention.
Figure 12:
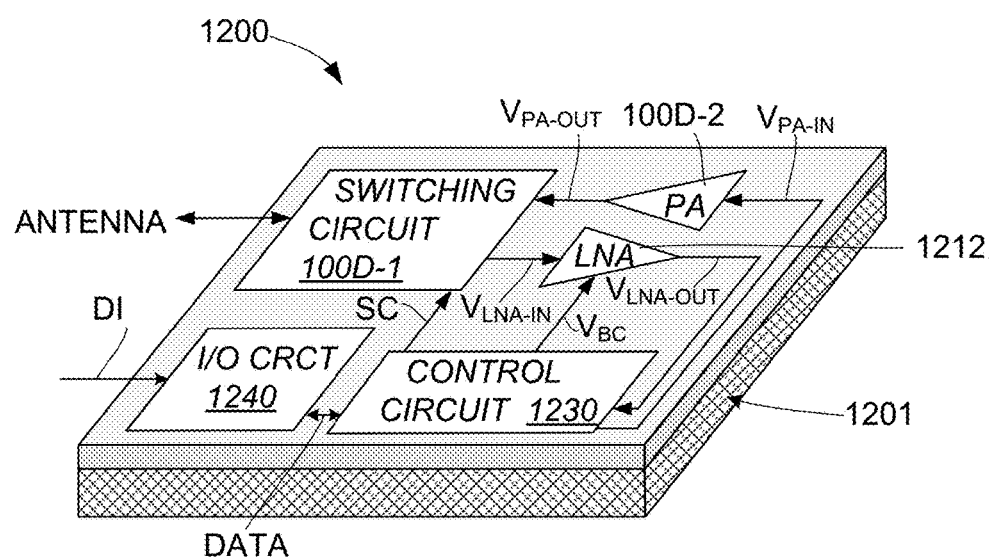
FIG. 12 is a simplified circuit diagram depicting a communication circuit including a power amplifier having a triple-layer stressing stack and air-gap-type low-k features according to another specific embodiment of the present invention.
Figure 13A:
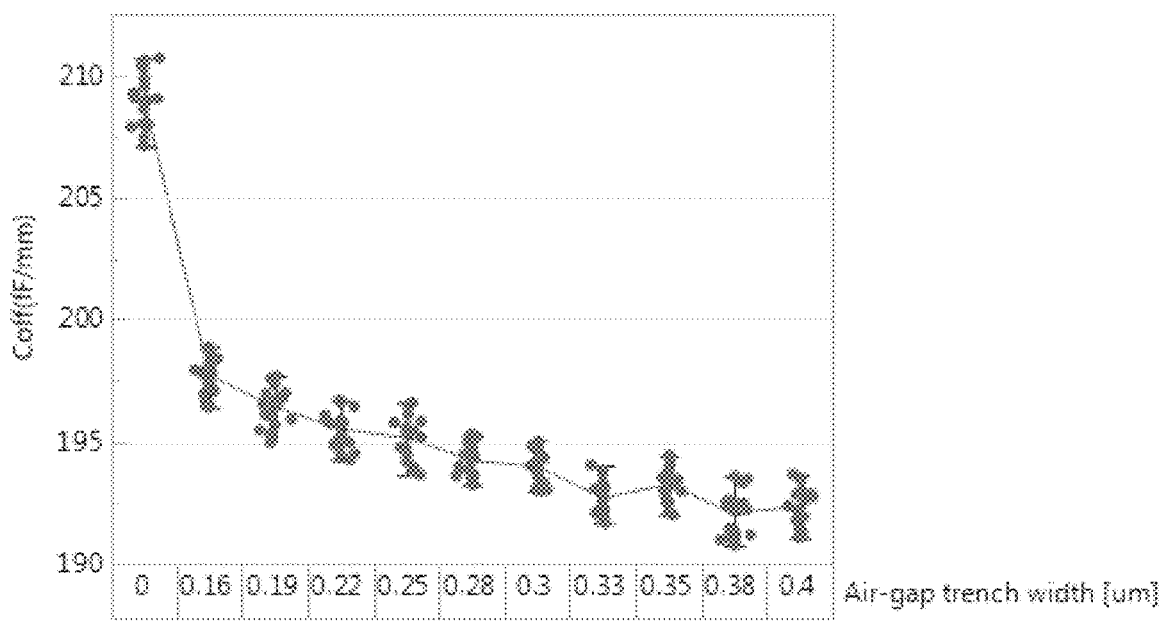
FIGS. 13A and 13B are graphs showing off-state capacitance (Coff) and on-state resistance (Roff) of conventional RF SOI switches that utilize intermetal air gap features.
Figure 13B:
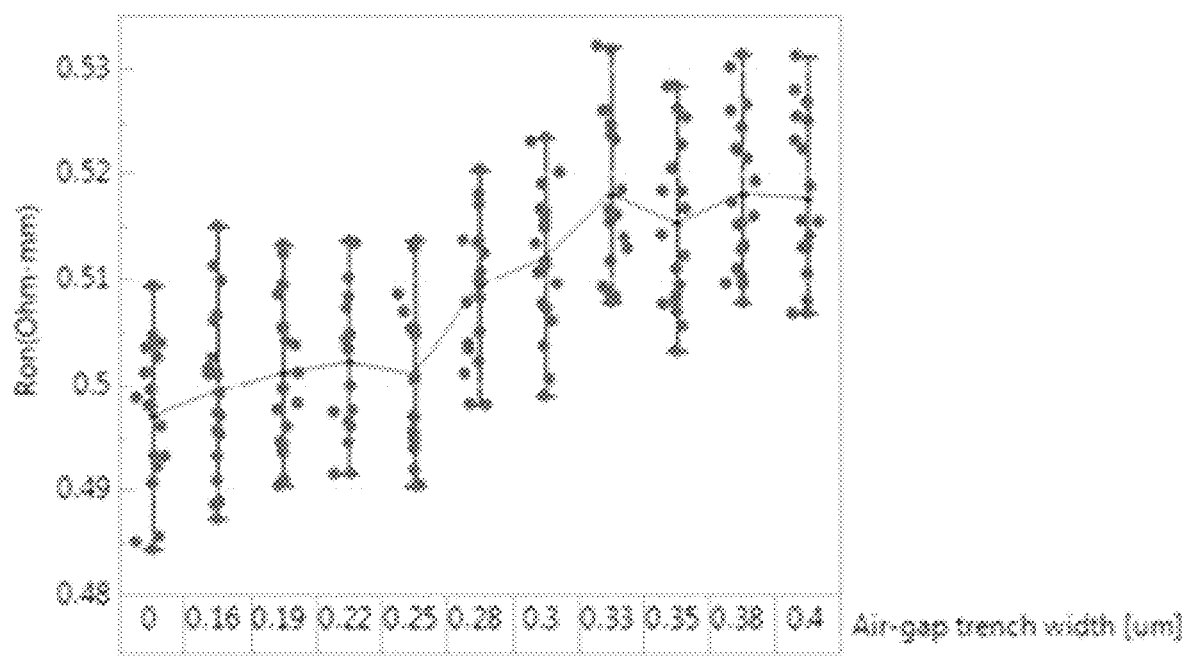

FIGS. 11 and 12 show circuits including RF IC devices produced in accordance with exemplary alternative practical embodiments of the present invention.

FIG. 11 depicts an RF SOI switch circuit 100C including a series branch 1131 made up of multiple series-connected NMOS FETs 1132-1/2/3/4 that are operably integrated into the main signal line 1101 and configured such that the FETs 1132-1/2/3/4 selectively turn on to pass RF signals RX/TX between a transmitter/receiver circuit 1110 and an antenna 1120 in accordance with actuation of a switch control signal RX/TX-ON. In this embodiment, NMOS FETs 1132-1/2/3/4 switch are fabricated to include the triple-layer stressing stack and the low-k features described above.

FIG. 12 depicts RF SOI power amplifier a simplified communication circuit 1200 including a switching circuit 100D-1 and a power amplifier circuit 100D-2 that are fabricated on a semiconductor (e.g., monocrystalline silicon) substrate 1201, along with conventional communication circuitry including a low-noise amplifier (LNA) circuit 1210, a control circuit 1230, and an I/O circuit (I/O CRCT) 1240. In one practical embodiment, communication circuit 1200 is configured for use on a cell phone or other portable electronic device and is characterized by performing data reception operations during which LNA circuit 1210 generates an amplified output signal $V_{LNA-OUT}$ in response to an unamplified input signal $V_{LNA-IN}$ received, for example, from switching circuit 100D-1. Communication circuit 1200 is also characterized by performing data transmission operations during which input data DI is transmitted to control circuit 1230 by way of I/O circuit 1240, and control circuit 1230 generates a corresponding power amplifier input signal $V_{PA-IN}$ that is supplied to power amplifier 100D-2, which is configured to generate a corresponding power amplifier output signal $V_{PA-OUT}$ that is transmitted by way of switching circuit 100D-1 to an antenna (not shown). In this embodiment, both switch 100D-1 and power amplifier 100D-2 are configured in accordance to include NMOS transistors having the triple-layer stressing stack and the low-k features described above.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to a triple-layer stressing stack, one or more additional layers may be included in the stressing stack without departing from the spirit of the invention.

The invention claimed is:

1. A method for fabricating a radio frequency (RF) device on a silicon-on-insulator (SOI) substrate, the method comprising:
   forming an NMOS transistor on a device layer of said SOI substrate such that said NMOS transistor includes first and second source/drain regions separated by a channel region in said device layer, and such that said NMOS transistor includes a polycrystalline silicon gate structure disposed over said channel region;
   forming first and second silicide structure on the first and second source/drain regions, respectively;
   forming a triple-layer stressing stack over the polycrystalline silicon gate structure and the first and second silicide structures such that the triple-layer stressing stack includes a stressor layer configured to generate a tensile mechanical stress in the channel region, an intermediate buffer layer disposed on an upper surface of the stressor layer, and an upper etch-stop layer disposed on an upper surface of the intermediate buffer layer;
   forming a first dielectric layer over the triple-layer stressing stack; and
   forming a low-dielectric-constant (low-k) feature in said first dielectric layer by removing a portion of the first dielectric layer and a portion of said upper etch-stop layer of said triple-layer stressing stack to form an air gap region located over the polycrystalline silicon gate structure.

2. The method of claim 1, wherein the device layer of said SOI substrate has a thickness in the range of 200 Angstroms to 2000 Angstroms, wherein the method further comprises separating said device layer into a plurality of electrically isolated silicon islands, and wherein said forming the NMOS transistor comprises forming said NMOS transistor on an associated silicon island of said plurality of silicon islands.

3. The method of claim 2,
   wherein forming the stressor layer comprises depositing a first dielectric material such that said deposited first dielectric material has a first residual tensile stress level that generates said tensile mechanical stress in the channel region, and
   wherein forming the upper etch-stop layer comprises depositing a second dielectric material such that said deposited second dielectric material has a second residual tensile stress level that is lower than said first residual tensile stress level.

4. The method of claim 3, further comprising:
   performing a first etching process to form first and second openings that respectively extend vertically through said first dielectric layer to first and second silicide structures respectively formed on said first and second source/drain regions;
   forming first and second metal contact/via structures in said first and second openings such that said first and second metal contact/via structures extend vertically through said first dielectric layer and contact said first and second silicide structures;
   forming a second dielectric layer over said first dielectric layer and said first and second interconnect lines; and
   forming first and second metal interconnect lines in said second dielectric layer over said first dielectric layer such that said first and second metal interconnect lines are disposed over and operably connected to said first and second metal contact/via structure, respectively, wherein forming said low-k feature comprises performing a second etching process such that a portion of said second dielectric layer is removed before removing said portions of said first dielectric layer and said upper etch-stop layer.

5. The method of claim 4, further comprising forming a first etch-stop layer on an upper surface of said first dielectric layer before forming said second dielectric layer, and forming a second etch-stop layer on an upper surface of said second dielectric layer after forming said first and second metal interconnect lines, wherein forming said first and second metal interconnect lines comprises depositing copper.

6. The method of claim 5, wherein performing said second etching process comprises:
performing a first anisotropic dry etch to remove a portion of said second etch-stop layer located over said portion of said second dielectric layer, to remove said portion of said second dielectric layer, and to remove a portion of said first etch-stop layer located under said portion of said second dielectric layer, thereby forming an upper air gap section over said polycrystalline silicon gate structure;
performing an isotropic dry etch through said upper air gap section to remove said portion of said first dielectric layer, thereby forming an intermediate air gap section over said polycrystalline silicon gate structure having a horizontal dimension in the range of 0.16 Angstroms to 0.34 Angstroms; and
performing a second anisotropic dry etch to remove said portion of said upper etch-stop layer.

7. A method of claim 6, wherein forming said low-k feature further comprises depositing a low-conformity dielectric material over said second dielectric layer such that said low-conformity dielectric material forms a third dielectric layer that seals said the air gap region.

8. A method of claim 7, further comprising forming a capping dielectric layer over the third dielectric layer using a low-moisture-penetration material such that said capping dielectric layer protects said the air gap region from moisture penetration.

9. The method of claim 3, wherein forming the lower dielectric layer comprises depositing a layer of one of Silicon Nitride and Oxynitride having a thickness T2 in the range of 500 Angstroms to 2000 Angstroms.

10. The method of claim 9, wherein forming the intermediate buffer layer comprises forming a layer of silicon dioxide having a thickness in the range of 10 Angstroms to 600 Angstroms.

11. The method of claim 10, wherein forming said upper etch-stop layer comprises forming one of a Silicon Nitride layer and an a-SiC:H material layer having a thickness in the range of 100 Angstroms to 600 Angstroms.

12. The method of claim 4, wherein performing said second etching process comprises:
performing a first anisotropic dry etch to remove said portion of said second dielectric layer;
performing an isotropic dry etch to remove said portion of said first dielectric layer; and
performing a second anisotropic dry etch to remove said portion of said upper etch-stop layer.

13. The method of claim 12, wherein performing the isotropic dry etch comprises forming an intermediate air gap section in said first dielectric layer having a horizontal dimension in the range of 0.16 Angstroms to 0.34 Angstroms.

14. The method of claim 1, wherein forming said low-k feature further comprises depositing a low-dielectric-constant material such that said low-dielectric-constant material fills said air gap region.

15. The method of claim 14, further comprises depositing a sealing material over said second dielectric layer such that said sealing material forms a sealing layer that covers an upper boundary of said low-k feature.

16. A method for fabricating a radio frequency (RF) device on a silicon-on-insulator (SOI) substrate, the method comprising:
forming an NMOS transistor on a device layer of said SOI substrate such that said NMOS transistor includes first and second source/drain regions separated by a channel region in said device layer, and such that said NMOS transistor includes a polycrystalline silicon gate structure disposed on an upper surface of the device layer over said channel region;
forming a stressor layer over the polycrystalline silicon gate structure and the first and second source/drain regions such that the stressor layer includes a first residual tensile stress level that generates a tensile mechanical stress in the channel region;
forming a buffer layer over the stressor layer;
forming an etch-stop layer over the buffer layer such that the etch-stop layer has a second residual tensile stress level that is lower than the first residual tensile stress level;
forming a first dielectric layer over the etch-stop layer;
performing a first etching process to define contact/via openings that extend through the first dielectric layer, the stressor layer, the buffer layer, and the etch-stop layer to upper portions of the device layer disposed over the first and second source/drain regions;
performing a second etching process to define an air gap region that extends through a portion of the first dielectric layer that is located over the polycrystalline silicon gate structure, wherein said second etching process is terminated when a lower boundary of said air gap region is located between an upper surface of said etch-stop layer and an upper surface of said stressor layer; and
forming a sealing layer over an upper end of said air gap region.

17. A radio frequency (RF) silicon-on-insulator (SOI) device formed on a device layer of an SOI substrate, the RF SOI device comprising:
first and second source/drain regions disposed in the device layer and separated by a channel region;
a polycrystalline silicon (polysilicon) gate structure disposed over the channel region;
first and second silicide structures disposed on an upper surface of the device layer over the first and second source/drain regions, respectively;
a triple-layer stressing structure disposed over the polysilicon gate structure and the first and second silicide structures, said triple-layer stressing stack including a stressor layer having a first residual tensile stress level that generates a tensile mechanical stress in the channel region, an intermediate buffer layer disposed on an upper surface of the stressor layer, and an upper etch-stop layer disposed on an upper surface of the intermediate buffer layer, wherein the upper etch-stop layer has a second residual tensile stress level that is lower than said first residual tensile stress level;
a first dielectric layer disposed on an upper surface of the triple-layer stressing structure, and a second dielectric layer disposed over the first dielectric layer, said first and second dielectric layers consisting essentially of one or more dielectric materials having a nominal first dielectric constant; and a low-dielectric-constant (low-k) feature disposed in said first dielectric layer over said polysilicon gate structure such that a lower boundary of said low-k feature extends into a portion of said upper etch-stop layer, wherein said low-k feature comprises one of a low-k material and a void region such that a second dielectric constant of said low-k feature is lower than said first dielectric constant of said at least one dielectric layer.

18. The RF SOI device of claim 17, wherein said RF SOI device comprises an RF SOI switch circuit.

19. The RF SOI device of claim 17, wherein said RF SOI device comprises an RF SOI power amplifier.

* * * * *